(12) United States Patent
Straeussnigg

(10) Patent No.: US 9,929,738 B2
(45) Date of Patent: Mar. 27, 2018

(54) SPECTRALLY SHAPED RANDOM SIGNAL

(71) Applicant: Infineon Technologies AG, Neubiberg (DE)

(72) Inventor: Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/427,737

(22) Filed: Feb. 8, 2017

(65) Prior Publication Data

US 2017/0257108 A1    Sep. 7, 2017

(30) Foreign Application Priority Data

Mar. 4, 2016   (DE) .................. 10 2016 103 995

(51) Int. Cl.
| | |
|---|---|
| H03M 1/06 | (2006.01) |
| H03M 1/08 | (2006.01) |
| H03K 3/84 | (2006.01) |

(52) U.S. Cl.
CPC ............ H03M 1/0854 (2013.01); H03K 3/84 (2013.01)

(58) Field of Classification Search
CPC ............................... H03M 1/0854; H03K 3/84
USPC .................. 341/143, 144, 145, 118, 120
See application file for complete search history.

(56) References Cited

U.S. PATENT DOCUMENTS

| | | | |
|---|---|---|---|
| 5,408,233 A | 4/1995 | Gannon et al. | |
| 5,528,692 A * | 6/1996 | Hester ............... | H04K 1/04 380/236 |
| 6,320,526 B1 * | 11/2001 | Gandolfi ............ | H03M 3/334 341/131 |
| 7,062,340 B2 * | 6/2006 | Melanson ........... | G10L 19/038 341/143 |
| 7,580,157 B2 | 8/2009 | Wei | |
| 9,385,745 B1 * | 7/2016 | Op 't Eynde ........ | H03F 3/505 |
| 2002/0136417 A1 * | 9/2002 | Ku ..................... | H03G 3/00 381/94.1 |
| 2005/0068212 A1 | 3/2005 | Jensen | |

FOREIGN PATENT DOCUMENTS

EP    2381578 A1    10/2011

OTHER PUBLICATIONS

Office Action, in the German language, from counterpart German Application No. 102016103995.0 dated Oct. 4, 2016, 7 pp.

* cited by examiner

*Primary Examiner* — Peguy Jean Pierre
(74) *Attorney, Agent, or Firm* — Shumaker & Sieffert, P.A.

(57) ABSTRACT

An apparatus (100) comprises a signal generator (101) that is set up to produce a digital random signal (191). The apparatus (100) also comprises at least one filter element (102, 121, 122) that is set up to apply a high pass filter and a low pass filter to the digital random signal (191) in order to produce a spectrally shaped random signal (112). The apparatus (100) also comprises a modulator (103) that is set up to apply the spectrally shaped random signal (192) as dither.

20 Claims, 9 Drawing Sheets

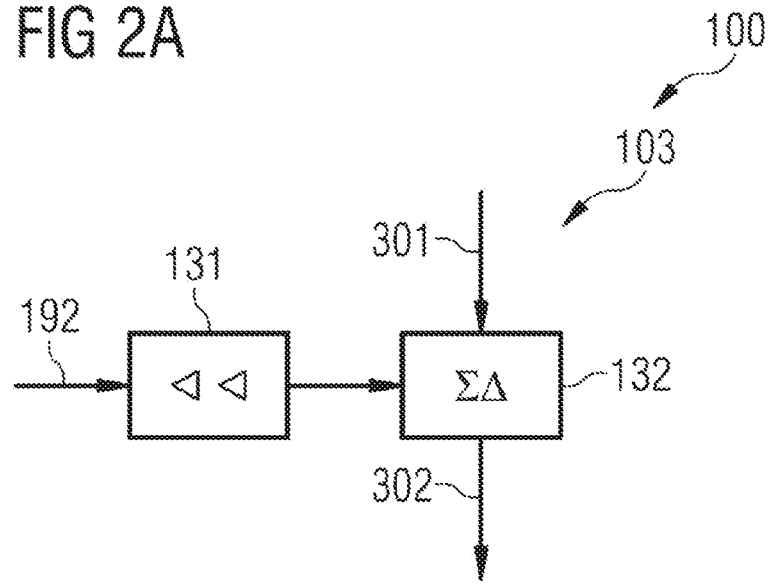
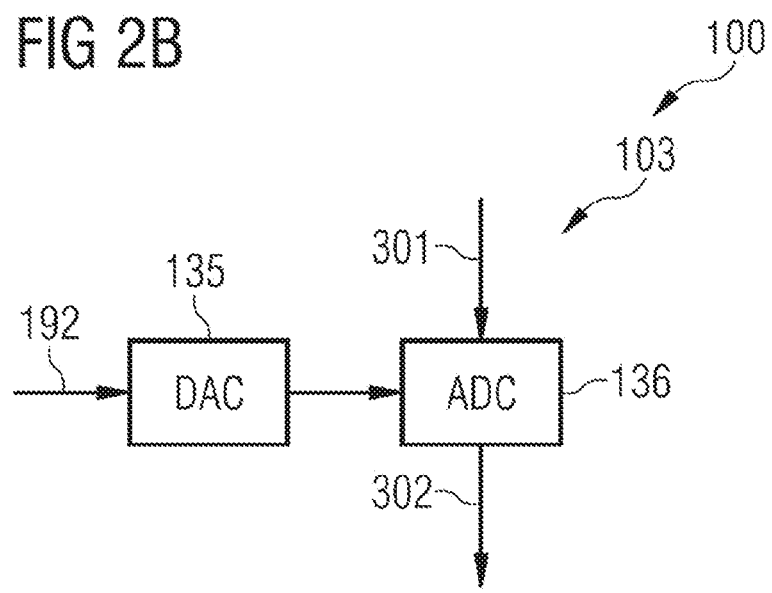

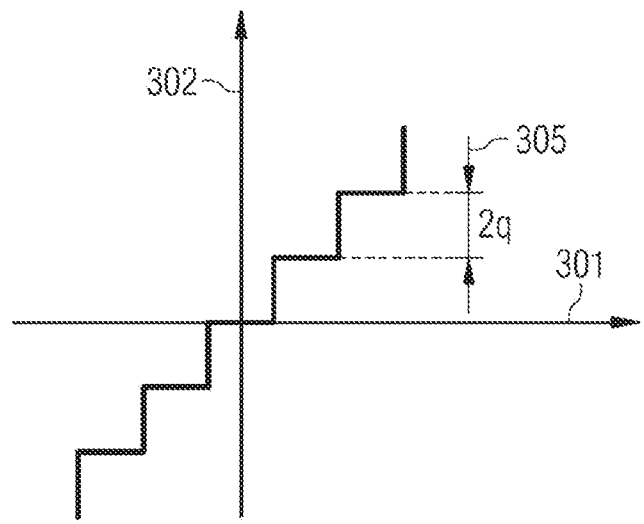
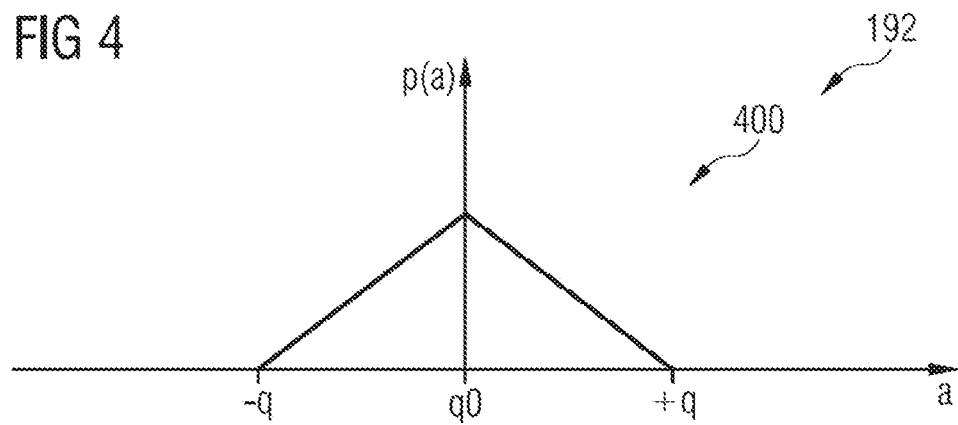

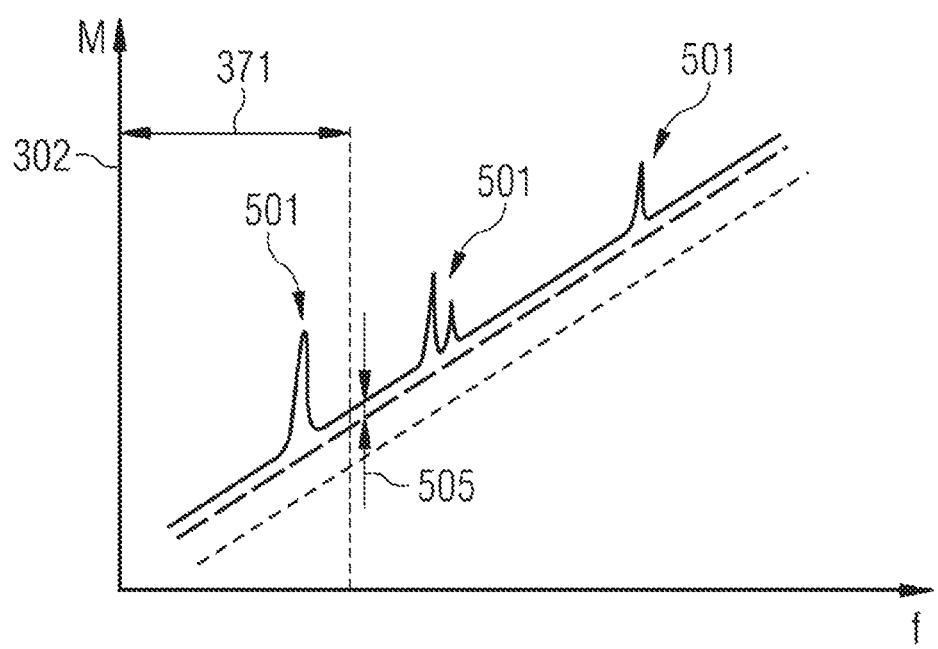

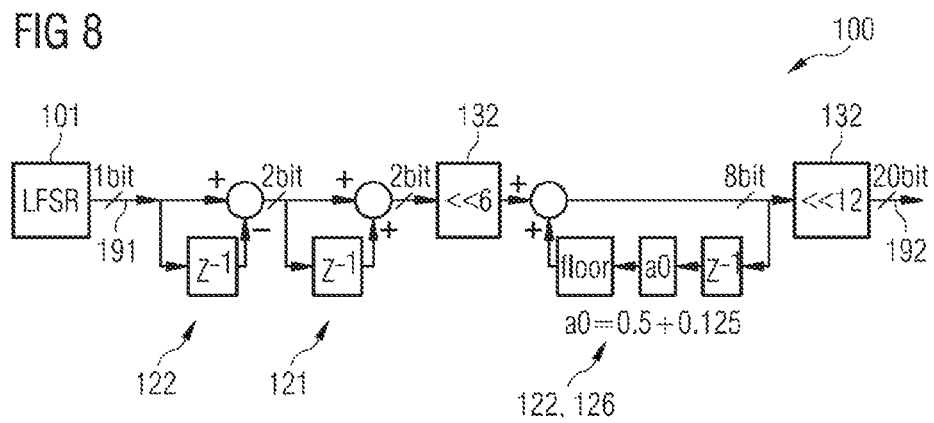
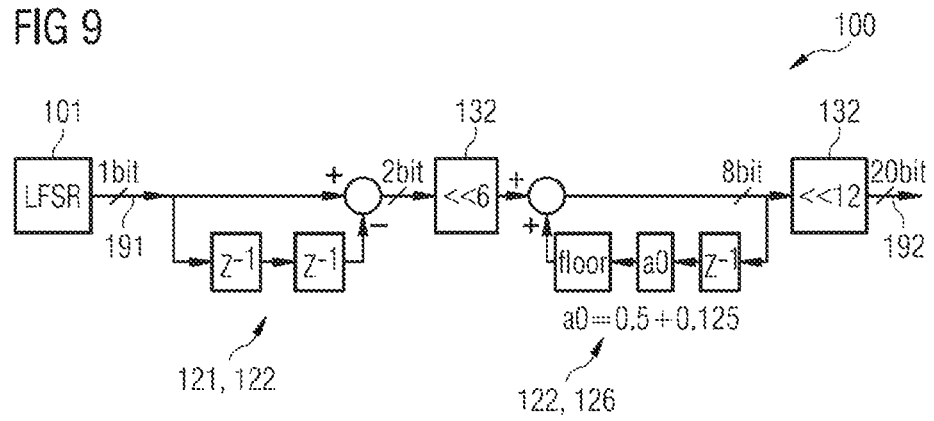

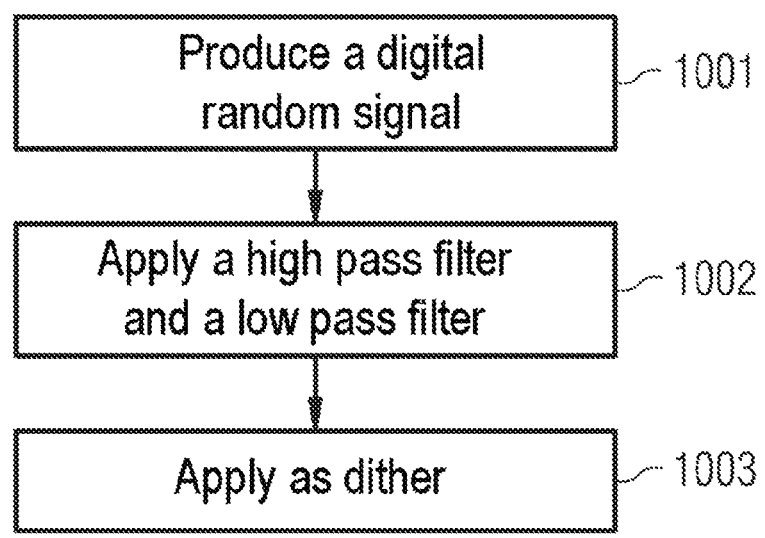

SPECTRALLY SHAPED RANDOM SIGNAL

TECHNICAL FIELD

Various embodiments relate to an apparatus that comprises a signal generator that is set up to produce a digital pseudorandom signal. The apparatus also comprises at least one filter element that is set up to apply a high pass filter and a low pass filter to the digital pseudorandom signal in order to produce a spectrally shaped pseudorandom signal in this way. The apparatus also comprises a modulator that is set up to apply the spectrally shaped pseudorandom signal as dither. Various embodiments relate to a corresponding method.

BACKGROUND

Modulators, such as analog-to-digital converters (ADC) or digital modulators, for example, typically produce quantization noise. The quantization noise can cause unwanted contributions in the output spectrum, what are known as spikes, that are sometimes also referred to as idle tones. The quantization noise generally causes a reduction in the quality of a modulator.

Techniques are known in order to reduce such unwanted contributions by the quantization noise e.g. in the form of spikes. These often involve a signal with variable amplitude (dither) being applied in the signal processing of the modulator, e.g. upstream of a quantizer. The amplitude of the dither typically varies on a random or pseudorandom basis. This lowers the signal-to-noise ratio (SNR) of the modulator, since additional noise is imparted in the form of the dither. At the same time, however, the effect achieved is that the quantization noise influences the output spectrum uniformly. This allows the spikes in the output spectrum to be eliminated or reduced, which can be worthwhile in various applications—for example in audio signal processing.

In various reference implementations, dither is produced by using an analog signal generator as a noise source. The analog signal generator can produce an analog random signal that can be spectrally shaped. The analog signal generator can produce a continuous random signal; quantization of the values of the analog random signal typically does not occur. The use of an analog signal generator can be comparatively expensive and complicated, however. The use of an analog signal generator can result in a comparatively high level of hardware complexity.

Therefore, techniques are also known that involve the use of a digital signal generator that produces a digital random signal. Typically, the random signal is pseudorandom with two states, for example ZERO and ONE. Such a scenario is also referred to as 1-bit dither.

A pseudorandom random signal can also be referred to as a pseudorandom signal. The pseudorandom signal can have values that repeat e.g. after a particular number of iterations.

If, in reference implementations, only a single digital signal generator is used, then the dither produced in this way typically does not have particularly good properties for reducing spikes. By way of example, in the case of conventional techniques of this kind that use only a single digital signal generator, the reduction in the SNR can turn out to be particularly severe.

In order to efficiently reduce spikes in the output spectrum of the modulator, a multiplicity of digital 1-bit signal generators is typically used, e.g. two or three or more digital signal generators; this allows what is known as multilevel dither, i.e. having multiple discrete states, e.g. −TWO, −ONE, ZERO, ONE, TWO, or even virtually continuous dither to be produced. Such implementation can have a large number of components, however, and hence be expensive and susceptible to error.

SUMMARY

Therefore, there is a need for improved techniques in order to produce dither. In particular, there is a need for techniques that firstly reduce spikes efficiently and that secondly reduce the SNR of a modulator only slightly.

This object is achieved by the features of the independent patent claims. The features of the dependent patent claims define embodiments.

In various embodiments, an apparatus comprises a signal generator. The signal generator is set up to produce a digital random signal. The apparatus also comprises at least one filter element. The at least one filter element is set up to apply a high pass filter and a low pass filter to the digital random signal; in this way, a spectrally shaped random signal is produced. The apparatus also comprises a modulator. The modulator is set up to apply the spectrally shaped random signal as dither.

In various embodiments, a method comprises the production of a digital random signal. The method also comprises the application of a high pass filter and a low pass filter to the random signal. In this way, a spectrally shaped random signal is produced. The method also comprises the application of the spectrally shaped random signal as dither.

In various embodiments, an apparatus comprises a signal generator. The signal generator is set up to produce a digital random signal. The apparatus also comprises at least one filter element. The at least one filter element is set up to apply a high pass filter and a low pass filter to the digital random signal; in this way, a spectrally shaped random signal is produced.

In various embodiments, a method comprises the production of a digital random signal. The method also comprises the application of a high pass filter and a low pass filter to the random signal. In this way, a spectrally shaped random signal is produced.

The features set out above and features that are described below can be used not only in the applicable explicitly depicted combinations but also in further combinations or in isolation without departing from the scope of protection of the present invention.

BRIEF DESCRIPTION OF THE FIGURES

The properties, features and advantages of this invention that are described above and also the way in which they are achieved will become clearer and more distinctly comprehensible in conjunction with the description of the exemplary embodiments that follows, which are explained in more detail in conjunction with the drawings.

FIG. 2A schematically illustrates details with reference to the modulator according to various embodiments.

FIG. 2B schematically illustrates details with reference to the modulator according to various embodiments.

FIG. 3 schematically illustrates quantization noise of the modulator.

FIG. 4 schematically illustrates a triangular probability density function of a spectrally shaped pseudorandom signal that can be used as dither in order to reduce spikes.

FIG. 5 schematically illustrates the output spectrum of the modulator with and without application of the dither.

FIG. 7 schematically illustrates an apparatus according to various embodiments, wherein FIG. 7 illustrates details with reference to a linear feedback shift register as a signal generator.

FIG. 8 schematically illustrates an apparatus according to various embodiments.

FIG. 9 schematically illustrates an apparatus according to various embodiments.

FIG. 11 is a flowchart for a method according to various embodiments.

DETAILED DESCRIPTION OF EMBODIMENTS

Figure 1A:
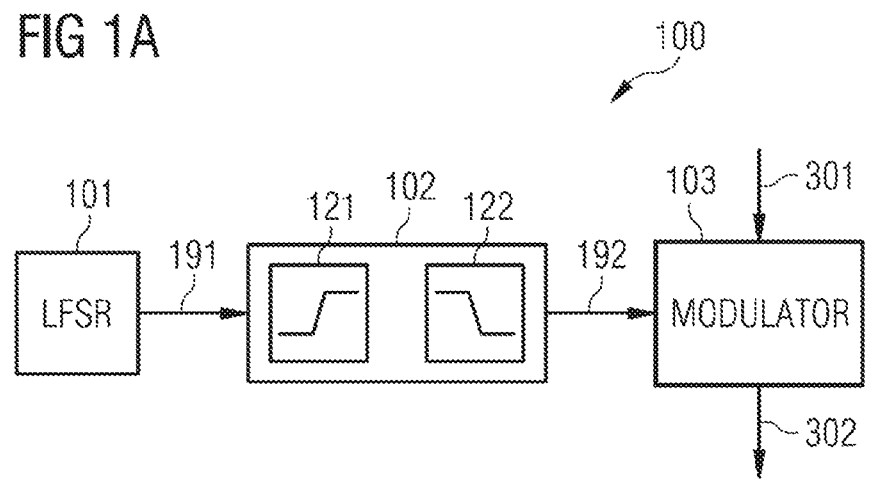
FIG. 1A is a schematic illustration of an apparatus according to various embodiments that comprises a signal generator, at least one filter element and a modulator.

The present invention is explained in more detail below using preferred embodiments with reference to the drawings. In the figures, like reference symbols denote like or similar elements. The figures are schematic representations of various embodiments of the invention. Elements depicted in the figures are not necessarily depicted as true to scale. Rather, the various elements depicted in the figures are reproduced such that their function and general purpose becomes clear to a person skilled in the art. Connections and couplings depicted in the figures between functional units and elements can also be implemented as indirect connection or coupling. A connection or coupling may be implemented in wired or wireless fashion. Functional units can be implemented as hardware, software or a combination of hardware and software.

Various techniques are described below in order to reduce unwanted contributions to the output spectrum of a modulator on account of spikes. The modulator modulates an input signal in order to obtain an output signal. The output spectrum can depict various characteristic properties of the output signal as a function of the input signal. The output spectrum can comprise a signal contribution that is stipulated by the input signal. The output spectrum can also comprise a noise contribution that is stipulated by noise. The noise can comprise e.g. quantization noise and/or white noise. The ratio between the signal contribution and the noise contribution defines the SNR.

The text below describes techniques that allow such reduction of the unwanted contributions to the output spectrum e.g. in the form of spikes, while at the same time a reduction in the SNR of the modulator turns out to be comparatively small.

In various examples, a digital random signal is spectrally shaped in order to obtain in this way a spectrally shaped random signal that can be applied as dither. The spectrally shaped random signal may be a multilevel signal that has a word length of greater than one.

In various examples, a multilevel dither is produced from a digital single-bit random signal.

The random signal may be computable (pseudorandom signal). The text below refers mainly to a pseudorandom signal of this kind. The applicable techniques can be applied directly to a genuinely random random signal, however, which is not computable.

In the various examples, the spectrally shaped pseudorandom signal can be produced particularly efficiently and without great hardware complexity. By way of example, in various examples, the spectrally shaped pseudorandom signal can be produced without an analog signal generator. In the various examples, the spectrally shaped pseudorandom signal can be produced with low hardware complexity.

For example, the digital pseudorandom signal can be produced by a single linear feedback shift register (LFSR). The application of a high pass filter and a low pass filter to the digital pseudorandom signal produced in this way can attain advantageous spectral shaping. This can reduce the unwanted contributions to the output spectrum e.g. in the form of spikes particularly efficiently; at the same time, the reduction in the SNR can turn out to be comparatively small.

Various examples described herein are based on the insight that the application of the high pass filter and the low pass filter can produce a triangular probability density function, for example, as a spectral shape of the spectrally shaped pseudorandom signal or of the dither. In this case, it is known that a triangular probability density function of this kind may be particularly advantageous for reducing the unwanted contributions to the output spectrum of the modulator e.g. in the form of spikes. For example see Wannamaker R. A. et al., "A Theory of Non-Substractive Dither" in IEEE Trans. Signal Processing 48 (2000) 499-516.

The spectral shaping of this kind for the digital pseudorandom signal allows the noise contribution to be advantageously spectrally distributed in various examples—in addition to the reduction of the unwanted contributions to the output spectrum e.g. in the form of spikes. In particular, the noise contribution can be distributed uniformly over the spectrum, so that the proportion of the noise contribution in the spectral subrange of the input signal (useful spectrum) can be reduced. This in turn allows the modulation of the input signal to be performed with comparatively high quality.

The various techniques described herein can be used in a wide variety of areas. For example, the techniques described herein can be used in the area of analog-to-digital conversion (AD conversion): it is then possible for the spectrally shaped pseudorandom signal to be applied as dither to an ADC. This may require a digital-to-analog conversion (DA conversion) of the spectrally shaped pseudorandom signal so as then to apply the latter as dither; e.g. the spectrally shaped random signal can be applied upstream of a quantizer of the modulator. In further examples, the techniques described herein can be used in the area of digital modulation: for example, the spectrally shaped pseudorandom signal can be applied as dither to a digital modulator, for example a sigma-delta modulator. This can allow diverse applications, for example in the area of audio signal processing, digital noise shaping, etc.

FIG. 1A schematically illustrates an apparatus 100 according to various examples. The apparatus 100 comprises a digital signal generator 101, for example an LFSR, a filter 102 and a modulator 103.

The LFSR 101 produces a digital pseudorandom signal 191 that is supplied to a filter 102. The digital pseudorandom signal 191 can have a deterministic sequence of different values, for example for different clocks; the sequence can repeat after a particular period length, which is why the signal 191 is referred to as pseudorandom. Whereas the example of FIG. 1A shows an LFSR 101 as signal generator, it is also possible to use other types of digital signal generators in other examples in order to produce the pseudorandom signal (pseudorandom number generator, PRNG). Examples include congruential generators, Well generators, etc.

The filter 102 is set up to apply a high pass filter and a low pass filter to the digital pseudorandom signal 191. To this end, the filter 102 in the example of FIG. 1A comprises a high pass filter element 121 and a low pass filter element 122. In various examples, it is possible for the high pass filter and the low pass filter to be implemented by a larger or smaller number of filter elements. E.g. it would be possible in various examples for the high pass filter element 121 and the low pass filter element 122 to be implemented together at least to some extent. E.g. it would be possible in various examples for the low pass filter element 122 also to have a recursive filter element (not depicted in FIG. 1A). The filter element 102 produces a spectrally shaped pseudorandom signal 192 that is supplied to a modulator 103.

The modulator 103 is set up to apply the spectrally shaped pseudorandom signal 192 as dither. The modulator 103 receives an input signal 301, for example an analog input signal or a digital input signal, modulates it and outputs an output signal 302, for example an analog output signal or a digital output signal.

From the example of FIG. 1A, it is possible to see that the dither is produced by using only a single digital signal generator 101. In this respect, the modulator 103 is set up to apply no further signal having a random component—i.e. computable randomly/pseudorandomly and/or noncomputable randomly—as dither. In the example of FIG. 1A, the dither is produced solely on the basis of the digital pseudorandom signal 191 that is produced by the signal generator 101. Therefore, the apparatus 100 has a comparatively low level of hardware complexity. This reduces costs and can reduce susceptibility to error at the same time.

Figure 1B:
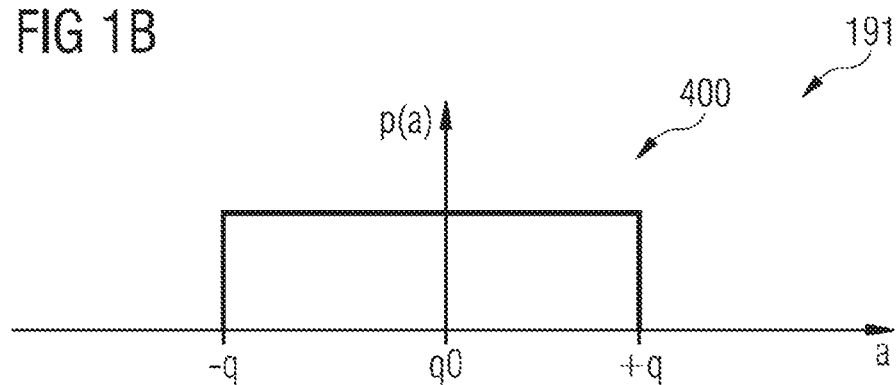
FIG. 1B schematically illustrates a rectangular probability density function of a digital pseudorandom signal that is produced by the signal generator.

FIG. 1B illustrates aspects with reference to a probability density function 400 of the digital pseudorandom signal 191. In FIG. 1B, it can be seen that the digital pseudorandom signal 191 has a rectangular probability density function 400 having uniform amplitude between extreme values +q and −q. E.g. the extreme values +q and −q vary according to the word length of the digital pseudorandom signal 191. The application of the digital pseudorandom signal 191 without spectral shaping, i.e. with the rectangular probability density function 400 according to the example of FIG. 1B, would admittedly reduce the unwanted contributions to the output spectrum of the modulator 103 e.g. in the form of spikes; at the same time, however, the SNR of the modulator 103 would be lowered to an unintentionally severe degree.

The text below describes techniques that allow the probability density function 400 to be shaped and, in this way, both good reduction of the unwanted contributions to the output spectrum of the modulator 103 and a comparatively small reduction in the SNR of the modulator 103 to be achieved. Shaping of the probability density function 400 can correspond to spectral shaping of the pseudorandom signal 191 in this case. Shaping of the probability density function 400 can mean irregular influencing of the amplitude p(a).

FIG. 2A illustrates aspects with reference to a digital modulator. The digital modulator 103 comprises a digital sigma-delta modulator 132. The sigma-delta modulator 132 converts a digital input signal 301 into a digital output signal 302. In order to produce compatibility between the digital input signal 301 and the spectrally shaped pseudorandom signal 192, the apparatus 100 also comprises a scaling element 131 that is set up to scale the spectrally shaped pseudorandom signal 192. For example, the scaling element 131 can perform a left-shift for the bits of the spectrally shaped pseudorandom signal 192. In particular, the scaling element 131 may be set up to perform the scaling on the basis of a quantization level of the modulator 103. In this way, matching to the input signal 301 can be effected.

FIG. 2B illustrates aspects with reference to an analog modulator 103, i.e. an ADC 136. Before the spectrally shaped pseudorandom signal 192 can be applied as dither by the ADC 136, the spectrally shaped pseudorandom signal 192 is subjected to a DA conversion by means of the DAC 135. In this case, the amplitude of the analog spectrally shaped pseudorandom signal can be scaled as appropriate at the same time, for example on the basis of the quantization level of the modulator 103.

FIG. 3 illustrates aspects with reference to the quantization level 305 of the modulator 103. FIG. 3 depicts the output signal 302 as a function of the input signal 301. FIG. 3 illustrates what is known as a transfer characteristic of the modulator 103. Various transfer characteristics are possible, FIG. 3 illustrating only one example.

From a comparison of FIGS. 1B and 3, it is possible to see that the digital pseudorandom signal 191 preferably covers a spectral range that corresponds to the quantization level $2q$, 305; if this is not the case (not depicted in FIG. 1B), then the scaling element 131 can be used to effect appropriate matching to the quantization level 305.

FIG. 4 illustrates aspects with reference to a probability density function 400 of the spectrally shaped pseudorandom signal 192. With reference to FIG. 4, it is possible to discuss the manner of operation of the filter element 102. From FIG. 4, it can be seen that the spectrally shaped pseudorandom signal 192 has a triangular probability density function 400 (TPDF). The TPDF 400 has particularly advantageous properties with reference to reducing the unwanted contributions to the output spectrum e.g. in the form of spikes.

A TPDF 400 is produced by applying the high pass filter and the low pass filter in combination. This has been able to be proved by empirical observations and simulations. Furthermore, this finding can be plausibilized by the following considerations: for example, a digital pseudorandom signal centered by a particular value q0 (e.g. q0=0) and having a particular word length and a rectangular probability density function 400 (cf. FIG. 1B) can be filtered using a moving average filter. In such a case, values close to the extreme values +q, −q are obtained only with comparatively low probability given averaging of sufficient length: e.g. the extreme value +q is obtained only when all values on which the average filtering is based are equal to +q. This is very improbable. Values close to the center q0 are obtained with higher probability: e.g. the value q0 is obtained when the values on which the average filtering is based are distributed regularly around q0, through to +q and −q. This is comparatively probable. Therefore, the amplitude of the probability density function 400 close to the extreme values +q, −q is reduced more severely than the amplitude of the probability density function 400 close to q0. The TPDF 400 is obtained (cf. FIG. 4). The action of the moving average filter corresponds in this case to that of the combination of the high pass filter and the low pass filter.

In the various examples, a wide variety of implementations can be used for the high pass filter and the low pass filter. For example, a first-order high pass filter can be used. Accordingly, it would be possible to use a first-order low pass filter. It has been found that an advantageous effect with reference to reduction of the unwanted contributions to the output spectrum of the modulator 103 e.g. in the form of spikes is attained if the low pass filter is in the form of a Chebyshev filter. Chebyshev filters are known fundamentally e.g. from: Smith S. W. "Digital Signal Processing", Newnes Publishers (2003), Chapter 20. Accordingly, it may be possible for the low pass filter to have a recursive component; i.e. a Z transfer function with a denominator different than one.

FIG. 5 illustrates aspects with reference to the output spectrum of the modulator 103 for various exemplary implementations. FIG. 5 depicts the magnitude of the output signal 302 as a function of the frequency (for example FIG. 5 could be a double logarithmic plot). FIG. 5 depicts the output spectrum of the modulator 103 for conventional techniques without dither (solid line); FIG. 5 also depicts the output spectrum of the modulator 103 for techniques according to various examples described herein (dashed line). The output spectrum of the reference implementations has spikes 501 that correspond to the unwanted contributions on account of quantization noise. The output spectrum that are described for the modulator 103 on the basis of the various techniques for producing dither described herein does not have these spikes 501. However, the magnitude 302 is reduced by a particular absolute value 505; this corresponds to a reduced SNR.

FIG. 5 also depicts the output spectrum of the modulator 103 according to conventional techniques for producing dither (dotted line). For example, the applicable output spectrum could be obtained by using a single-bit sequence without spectral shaping, which is produced by a single LFSR. From FIG. 5, it can be seen that the applicable output spectrum has a particularly severely reduced SNR, particularly in comparison with the output spectrum that can be obtained according to the techniques described herein.

Therefore, the techniques described herein can both efficiently moderate effects of the quantization noise e.g. in the form of spikes and reduce the SNR comparatively slightly.

FIG. 5 also depicts the useful spectrum 371. The useful spectrum 371 has the relevant components of the input signal 301 within it. In various examples, it may be worthwhile to reduce the spikes 501 particularly in the useful spectrum 371. However, in various examples, it may also be worthwhile to additionally reduce the spikes 501 outside the useful spectrum 371. The reason is that these can have repercussions for the useful spectrum 371 as a result of intermodulations or mixed products.

Figure 6:
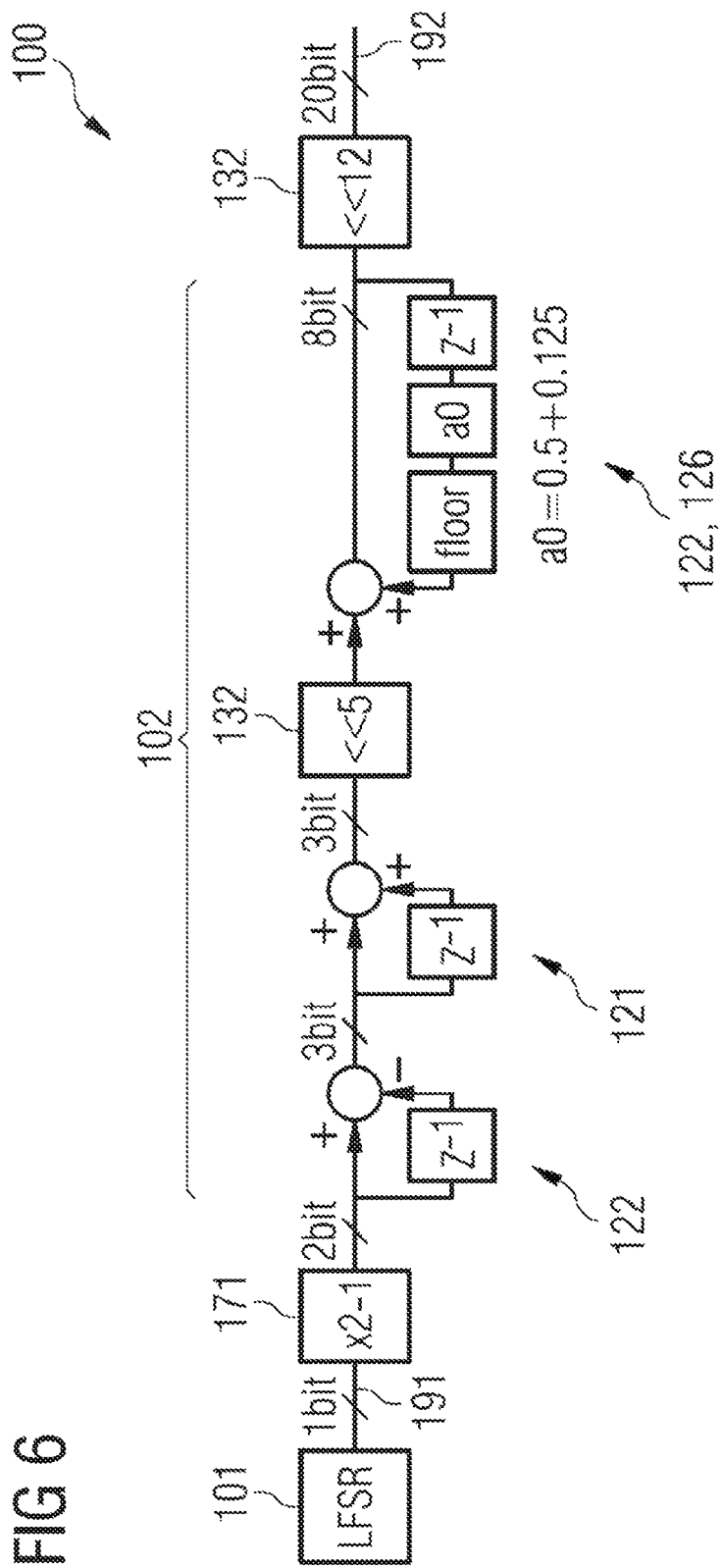
FIG. 6 schematically illustrates an apparatus according to various embodiments.

FIG. 6 is a circuit diagram that illustrates aspects with reference to an implementation of the apparatus 100 according to different examples. FIG. 6 depicts the LFSR 101, which outputs the digital pseudorandom signal 191 with a word length equal to one. In other examples, the digital pseudorandom signal 191 can also have a longer word length, for example equal to two or three.

In the example of FIG. 6, the apparatus 101 comprises centering element 171, which is set up to reduce a DC component of the digital pseudorandom signal 191. In the example of FIG. 6, for the word length one of the pseudorandom signal 191, the centering element 171 is implemented by the function: multiplication by two and subtraction of one. This maps the value ONE of the digital pseudorandom signal 191 onto the value ONE of the centered digital pseudorandom signal; the value ZERO of the digital pseudorandom signal 191 is mapped onto the value −ONE of the centered digital pseudorandom signal. The centering element 171 is optional. In particular, in various examples, the function of reducing the DC component can also be attained by producing the high pass filter as a differentiating element. By removing the DC component, it is possible to effect coordination with the quantization levels.

Subsequently, the centered digital pseudorandom signal obtained in this way is supplied to the filter element 102. In the example of FIG. 6, a component is initially implemented a low pass filter element 122. In this case, a delay element is implemented in a side path, the output of the delay element being subtracted from the main path. Accordingly, a high pass filter element 121 is subsequently implemented, with the output of the delay element being added to the main path at that point. Subsequently, scaling by left-shift is effected and a recursive component of the low pass filter is applied by an applicable recursive element 126. Finally, the scaling element 132, which is in turn implemented as a left-shift, is transited.

From the example of FIG. 6, it can be seen that the word length of the spectrally shaped pseudorandom signal 192 is longer than the word length of the digital pseudorandom signal 191 (in the example of FIG. 6, the spectrally shaped pseudorandom signal 192 has a word length of 20 bits, whereas the digital pseudorandom signal 191 has a word length of 1 bit). This allows high-resolution spectral shaping of the spectrally shaped pseudorandom signal 192 to be effected. This allows the TPDF 400 to be implemented particularly well. It is possible to use a multilevel signal as dither.

Figure 7:
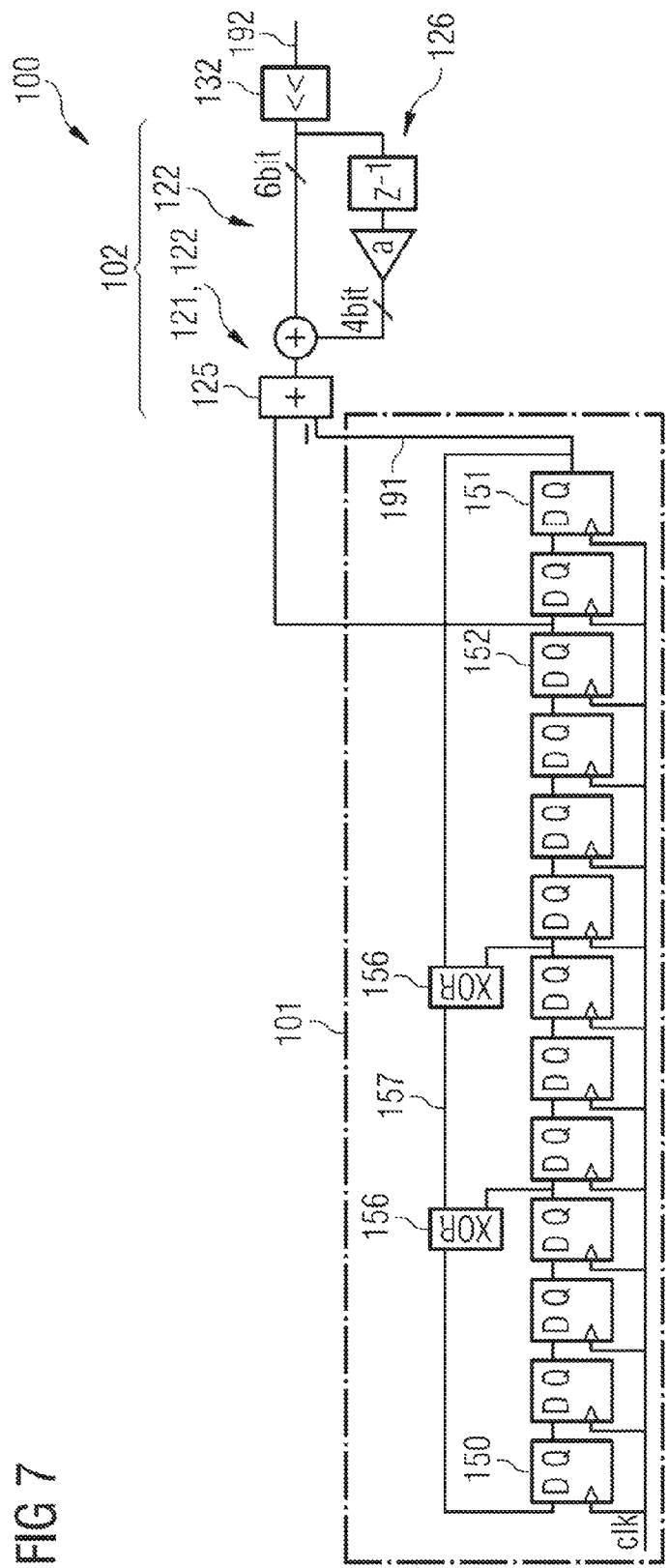

FIG. 7 is a circuit diagram that illustrates aspects with reference to an implementation of an apparatus 100 according to various examples. FIG. 7 depicts particularly the LFSR 101 in detail. From FIG. 7, it can be seen that the LFSR 101 comprises a multiplicity of series-coupled storage elements 150, 151, 152 (not all storage elements are numbered in FIG. 7 for reasons of simplicity). The LFSR 101 also comprises a feedback path 157 to which values from particular storage elements are respectively fed by means of logic XOR combinations. The value of the last storage element 151 arranged in this chain is read, as a result of which the digital pseudorandom signal 191 is obtained; as only a single one-bit storage element 151, e.g. a flip flop, is read, the digital pseudorandom signal has a word length equal to one.

In the example of FIG. 7, the filter element 102 is implemented partly in combination with the LFSR 101. In this case, the value of the storage element 151 as the digital pseudorandom signal 191 is combined with the value of the storage element 152. The storage element 152 is arranged in the chain of storage elements of the LFSR 101 in a manner shifted by two clock cycles with reference to the storage element 151. This corresponds to a combination of the two delay elements of the high pass filter element 121 and the low pass filter element 122 from FIG. 6. Such an implementation can lower the hardware complexity further.

The recursive filter element 126 in FIG. 7 is implemented in accordance with the recursive filter element 126 from FIG. 6. FIG. 6 also depicts exemplary filter coefficients for the recursive filter element 126.

FIG. 7 also contains a scaling element 132. The scaling element 132 perform various functions. For example, the scaling element 132—as described above with reference to FIG. 2A—can allow the amplitude of the spectrally shaped pseudorandom signal 192 to be matched to the quantization level 305 of the modulator 103. Alternatively, the scaling element 132 can be used to apply particular multiplicative factors in the Z transfer function of the high pass filter and/or of the low pass filter. In such an example, it is possible for the scaling element 132 and the filter element 102 to be implemented at least to some extent in combination, for example. For example, the low pass filter could implement the following Z transfer function:

$$H(z) = \frac{0.1662z + 0.1662}{z - 0.6675}$$

It would then be possible for the multiplicative factor 0.1662 in the numerator of the Z transfer function to be implemented by the scaling element 132. The remainder of the Z transfer function can then be implemented by the low pass filter element 122 and the recursive filter element 126:

$$H(z) = 0.1662 \frac{z + 1}{z - 0.6675}$$

i.e. 0.1662: scaling element; z+1: low pass filter element 122; and 1/(z−0.6675): recursive filter element 126.

FIG. 8 illustrates a further exemplary implementation of the apparatus 100. The example of FIG. 8 fundamentally corresponds to the example of FIG. 6. However, the apparatus 100 according to the example of FIG. 8 has no centering element; in this case, the function of centering is performed by the high pass filter element 121, which is implemented as a differentiating element. Moreover, in the example of FIG. 8, different scaling factors are implemented by the scaling elements 132.

FIG. 9 illustrates a further exemplary implementation of the apparatus 100. The example of FIG. 9 fundamentally corresponds to the example of FIG. 8. In the example of FIG. 9, the high pass filter element 121 and the low pass filter element 122 are implemented in combination.

Figure 10:
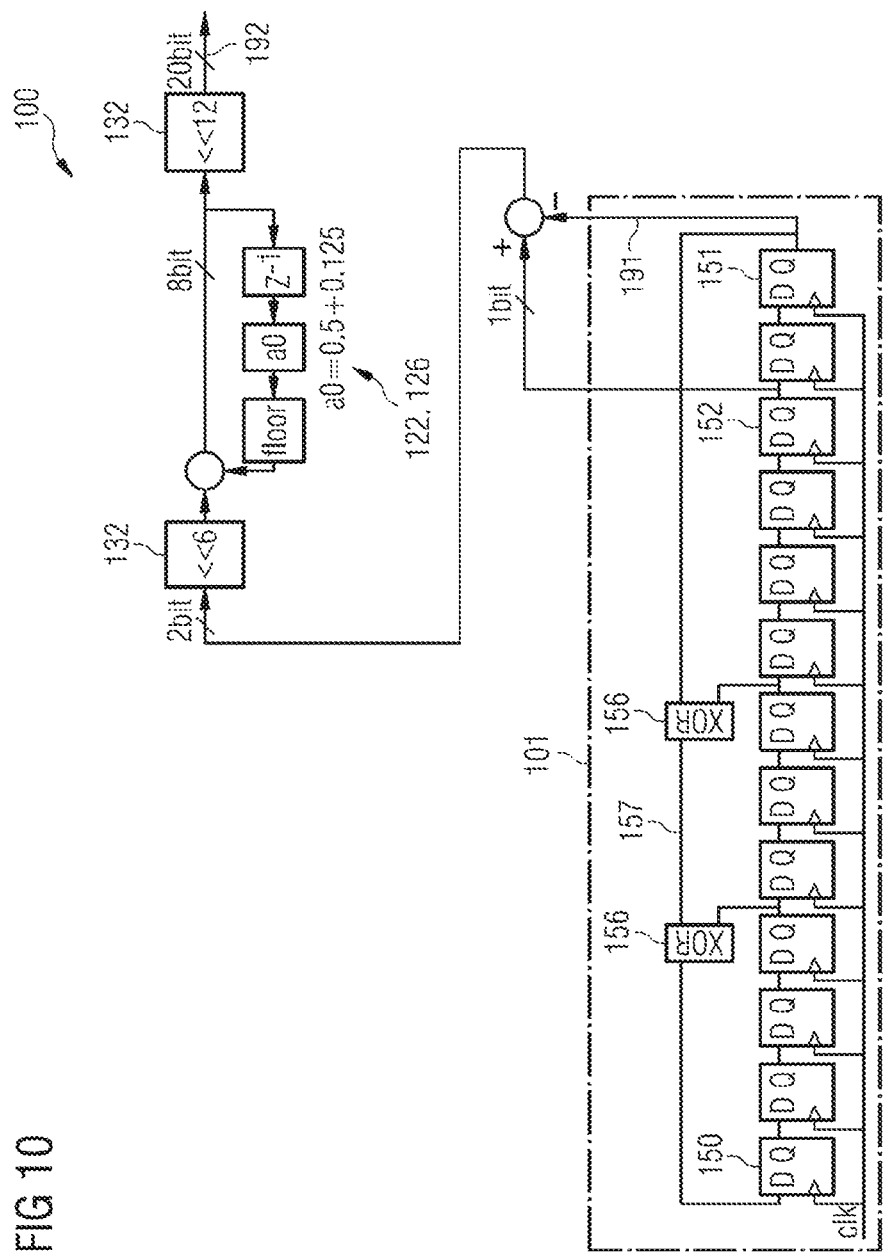
FIG. 10 schematically illustrates an apparatus according to various embodiments.

FIG. 10 illustrates a further exemplary implementation of the apparatus 100. The example of FIG. 10 fundamentally corresponds to the examples of FIGS. 8 and 9. In the example of FIG. 10, the high pass filter element 121 and the low pass filter element 122 are implemented by combining the values of the storage elements 151, 152 of the LFSR 101, as explained above with reference to FIG. 7.

FIG. 11 is a flowchart for a method according to various embodiments. First of all, the digital pseudorandom signal 191 is produced in step 1001. This can be accomplished by using the LFSR as a digital signal generator 101, for example. The digital pseudorandom signal 101 can have different word lengths; for example, the digital pseudorandom signal 191 can have a word length equal to one (single bit). In various examples, only a single digital pseudorandom signal 191 is produced by a single digital signal generator 101.

Subsequently, a high pass filter and a low pass filter are applied to the digital pseudorandom signal 191 in step 1002 in order to obtain the spectrally shaped pseudorandom signal 192. Step 1002 can comprise transit through one or more filter elements 102, 121, 122, 126. In particular, a Chebyshev filter can be used as low pass filter.

The spectrally shaped pseudorandom signal 192 obtained in this way is then applied as dither in step 1003.

In summary, techniques have been described above in order to produce dither efficiently; the dither can be used to reduce unwanted contributions in the output spectrum of an ADC or of a digital modulator while the additional noise power in the relevant spectral range is minimized at the same time. This allows a modulator having a comparatively good SNR to be implemented.

It goes without saying that the features of the embodiments and aspects of the invention that are described above can be combined with one another. In particular, the features can be used not only in the combinations described but also in other combinations or by themselves, without departing from the scope of the invention.

While many references have been made to an LFSR as a digital signal generator in the various examples above, it is also possible to use other types of PRNGs in other examples.

While reference has been made to a pseudorandom signal in various examples above, applicable techniques can also be applied to a genuinely random signal.

While reference has been made to the use of the spectrally shaped random signal as dither for a modulator in various examples above, it is also possible, in various further examples, to use the spectrally shaped random signal for further applications. Therefore, in various examples, it is not necessary for an apparatus, as described herein, to comprise a modulator.

The invention claimed is:

1. An apparatus comprising:
   a signal generator that is configured to generate a digital pseudorandom signal;
   at least one filter element that is connected in series with the signal generator and that is configured as a high pass filter and a low pass filter to generate a spectrally-shaped pseudorandom signal from the digital pseudorandom signal; and
   a modulator that is connected in series with the at least one filter element and that is configured to receive an input signal and dither the input signal with the spectrally-shaped pseudorandom signal to generate an output signal.

2. The apparatus according to claim 1, wherein the spectrally-shaped pseudorandom signal has a triangular probability density function.

3. The apparatus according to claim 1, wherein the low pass filter is a Chebyshev filter.

4. The apparatus according to claim 1, wherein the low pass filter comprises a recursive component.

5. The apparatus according to claim 1, wherein the signal generator comprises a linear feedback shift register having a multiplicity of series-coupled storage elements, and wherein the at least one filter element is configured to implement the high pass filter and the low pass filter by combining a value of a first storage element of the multiplicity of series-coupled storage elements and a value of a second storage element of the multiplicity of series-coupled storage elements that is different than the first storage element.

6. The apparatus according to claim 1, wherein the digital pseudorandom signal has a first word length, and wherein the spectrally-shaped pseudorandom signal has a second word length that is longer than the first word length.

7. The apparatus according to claim 6, wherein the first word length is equal to one.

8. The apparatus according to claim 1, further comprising a centering element that is configured to reduce a DC component of the digital pseudorandom signal.

9. The apparatus according to claim 1, wherein the modulator is a digital modulator.

10. The apparatus according to claim 1, wherein the modulator is an analog-to-digital converter.

11. The apparatus according to claim 1, wherein the modulator is configured to dither the input signal only with the spectrally-shaped pseudorandom signal.

12. The apparatus according to claim 1, further comprising a scaling element that is configured to scale the spectrally-shaped pseudorandom signal.

13. A method comprising:
producing, by a signal generator, a digital pseudorandom signal;
filtering, by at least one filter that is connected in series with the signal generator and that is configured as a high pass filter and a low pass filter, the digital pseudorandom signal to generate a spectrally-shaped pseudorandom signal from the digital pseudorandom signal; and
dithering, by a modulator that is connected in series with the at least one filter and that is configured to receive as input an input signal and the spectrally-shaped pseudorandom signal, the input signal with the spectrally-shaped pseudorandom signal to generate an output signal.

14. The method according to claim 13, wherein the spectrally-shaped pseudorandom signal has a triangular probability density function.

15. The method according to claim 13, wherein the low pass filter is a Chebyshev filter.

16. The method according to claim 13, wherein the low pass filter comprises a recursive component.

17. The method according to claim 13, wherein the signal generator comprises a linear feedback shift register having a multiplicity of series-coupled storage elements, and wherein filtering the digital pseudorandom signal to generate the spectrally-shaped pseudorandom signal from the digital pseudorandom signal comprises:
combining a value of a first storage element of the multiplicity of series-coupled storage elements and a value of a second storage element of the multiplicity of series-coupled storage elements that is different than the first storage element.

18. The method according to claim 13, wherein the digital pseudorandom signal has a first word length, and wherein the spectrally-shaped pseudorandom signal has a second word length that is longer than the first word length.

19. The method according to claim 13, further comprising reducing a DC component of the digital pseudorandom signal.

20. The method according to claim 13, further comprising dithering the input signal only with the spectrally-shaped pseudorandom signal to generate the output signal.

* * * * *